United States Patent
Jiang et al.

(10) Patent No.: US 9,722,117 B1
(45) Date of Patent: Aug. 1, 2017

(54) METHOD FOR MANUFACTURING CRYSTALLINE SILICON SOLAR CELL MODULES

(71) Applicants: Zhejiang Jinko Solar Co., Ltd., Zhejiang (CN); Jinko Solar Co., Ltd., Jiangxi (CN)

(72) Inventors: Fangdan Jiang, Zhenjiang (CN); Guangdong He, Zhejiang (CN); Lujia Xu, Singapore (SG); Hao Jin, Jiangxi (CN)

(73) Assignees: Zhejiang Jinko Solar Co., Ltd. (CN); Jinko Solar Co., Ltd. (CN)

( * ) Notice: Subject to any disclaimer, the term of this patent is extended or adjusted under 35 U.S.C. 154(b) by 0 days.

(21) Appl. No.: 15/155,713

(22) Filed: May 16, 2016

(30) Foreign Application Priority Data

Jan. 8, 2016 (CN) .......................... 2016 1 0014848

(51) Int. Cl.
*H01L 21/00* (2006.01)
*H01L 31/048* (2014.01)
(Continued)

(52) U.S. Cl.
CPC ........ *H01L 31/0488* (2013.01); *H01L 31/028* (2013.01); *H01L 31/0504* (2013.01);
(Continued)

(58) Field of Classification Search
CPC ............. H01L 31/0488; H01L 31/0504; H01L 31/028; H01L 31/1864; H01L 25/042;
(Continued)

(56) References Cited

U.S. PATENT DOCUMENTS

2006/0283495 A1 12/2006 Gibson
2011/0114154 A1* 5/2011 Lichy ................ H01L 31/02013
136/246
(Continued)

FOREIGN PATENT DOCUMENTS

| CN | 101533872 A | 9/2009 |
|---|---|---|
| CN | 102157582 A | 8/2011 |
| CN | 103762275 A | 4/2014 |

OTHER PUBLICATIONS

Chinese Patent Application No. 201610014848.9: First Office Action dated Sep. 5, 2016, 13 pages.

*Primary Examiner* — Thanh Y Tran
(74) *Attorney, Agent, or Firm* — Baker & Hostetler LLP

(57) ABSTRACT

The disclosure relates to solar cell, and especially to a method for manufacturing a crystalline silicon solar cell module. The method includes: a) providing a solar cell module to be laminated, including a back plate, a first bonding layer, a crystalline silicon solar cell component, a second bonding layer and a top plate in contact in sequence, where the crystalline silicon solar cell component is a crystalline silicon solar cell or a cell string formed by connecting multiple crystalline silicon solar cells; b) laminating the solar cell module to be laminated under current injection, to obtain a laminated solar cell module; and c) installing a frame and a junction box on the laminated solar cell module, to obtain a crystalline silicon solar cell module. The crystalline silicon solar cell module is under the current injection during the laminating process, improving the performance against light-induced degradation.

9 Claims, 1 Drawing Sheet

(51) Int. Cl.
*H01L 31/18* (2006.01)
*H01L 31/028* (2006.01)
*H01L 31/05* (2014.01)
*H02S 30/10* (2014.01)
*H02S 40/34* (2014.01)

(52) U.S. Cl.
CPC .......... *H01L 31/1864* (2013.01); *H02S 30/10* (2014.12); *H02S 40/34* (2014.12)

(58) Field of Classification Search
CPC ......... H01L 31/02008; H01L 31/02013; H01L 31/022425
See application file for complete search history.

(56) References Cited

U.S. PATENT DOCUMENTS

| | | | | |
|---|---|---|---|---|
| 2011/0271999 | A1* | 11/2011 | Almogy | ..................... F24J 2/07 |
| | | | | 136/246 |
| 2013/0037107 | A1* | 2/2013 | Cheng | ................. H01L 31/0481 |
| | | | | 136/259 |
| 2016/0013342 | A1* | 1/2016 | Koide | ................. H01L 31/0481 |
| | | | | 136/259 |

\* cited by examiner

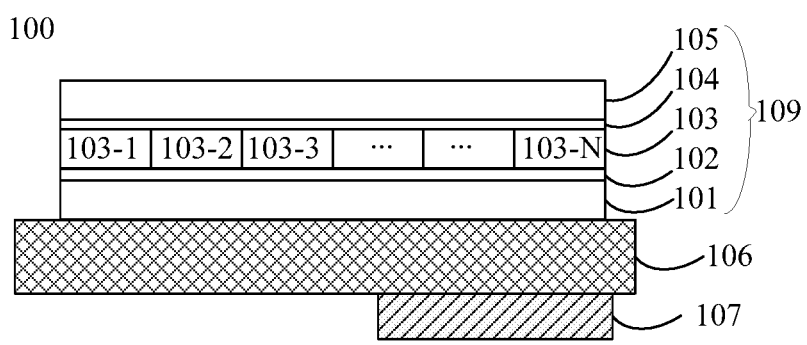

METHOD FOR MANUFACTURING CRYSTALLINE SILICON SOLAR CELL MODULES

CROSS-REFERENCE TO RELATED APPLICATION

This application claims priority of Chinese Patent Application No. 201610014848.9 titled as "METHOD FOR MANUFACTURING CRYSTALLINE SILICON SOLAR CELL MODULES" and filed on Jan. 8, 2016, the entirety of which is incorporated by reference herein.

TECHNICAL FIELD

The present disclosure relates to the field of solar cell, and especially to a method for manufacturing a crystalline silicon solar cell module.

BACKGROUND

A crystalline silicon solar cell module is a solar cell module with crystalline silicon functioning as photoelectric conversion material, and a manufacturing method therefor may roughly include the following: 1) manufacturing or buying crystalline silicon solar cells; 2) soldering the cells to form a cell string; 3) stacking and laminating a top plate, a bonding layer, the cell string and a back plate: and 4) installing a frame and a junction box for the laminated cell module to obtain a final product of a crystalline silicon solar cell module. As a crystalline silicon solar cell has high cell efficiency and the manufacturing technique therefor is the most mature, the crystalline silicon solar cell occupies a dominant position in mass application and industrial production.

Light-induced degradation of the crystalline silicon solar cell is a major technical problem in the crystalline silicon solar cell industry currently. The light-induced degradation is a phenomenon that the output power of the solar cell exposed to light reduces. Researches show the main reason for the light-induced degradation of the crystalline silicon solar cell is that doped boron in a p-type crystalline silicon cell can react with oxygen impurities in the cell under illumination to generate boron oxygen complex (B—O) and the B—O is a recombination center which increases recombination in the crystalline silicon solar cell, which thus reduces the life time of minority carriers in the cell and thereby causes output power of the cell and the module including the cell to be reduced.

Thus, it is necessary to improve the current technique for manufacturing a crystalline silicon solar cell module that has a performance against light-induced degradation.

SUMMARY

In view of above, the present disclosure is to provide a method for manufacturing a crystalline silicon solar cell module, and the crystalline silicon solar cell module manufactured by using the method according to the present disclosure has a good performance against light-induced degradation.

A method for manufacturing a crystalline silicon solar cell module is provided according to the present disclosure, which includes the following steps:

a) providing a solar cell module to be laminated, where the solar cell module to be laminated includes a back plate, a first bonding layer, a crystalline silicon solar cell component, a second bonding layer and a top plate which are in contact in sequence, where the crystalline silicon solar cell component is a crystalline silicon solar cell or a cell string formed by connecting multiple crystalline silicon solar cells;

b) laminating the solar cell module to be laminated under a condition of current injection, to obtain a laminated solar cell module; and c) installing a frame and a junction box on the laminated solar cell module, to obtain a crystalline silicon solar cell module.

Preferably, a current for the current injection is 8~20 A.

Preferably, a temperature for the laminating is 120~200 degrees Celsius.

Preferably, a vacuum for the laminating is smaller than or equal to $10^{-4}$ Pa.

Preferably, a duration of the laminating is 10~30 min.

Preferably, the cell string is manufactured by the following:

detecting cell efficiencies of multiple crystalline silicon solar cells; and soldering multiple crystalline silicon solar cells with cell efficiencies within a predetermined range to obtain the cell string.

Preferably, before the detecting cell efficiencies of multiple crystalline silicon solar cells, the method further includes:

performing an annealing process on the crystalline silicon solar cells.

Preferably, a temperature for the annealing process is 15~0300 degrees Celsius.

Preferably, a duration of the annealing process is 15~40 min.

Preferably, the cell string is formed by connecting multiple crystalline silicon solar cells in series.

Compared with conventional technology, a method for manufacturing a crystalline silicon solar cell module is provided according to the present disclosure. The method according to the present disclosure includes the following steps: a) providing a solar cell module to be laminated, where the solar cell module to be laminated includes a back plate, a first bonding layer, a crystalline silicon solar cell component, a second bonding layer and a top plate which are in contact in sequence, where the crystalline silicon solar cell component is a crystalline silicon solar cell or a cell string formed by connecting multiple crystalline silicon solar cells; b) laminating the solar cell module to be laminated under a condition of current injection, to obtain a laminated solar cell module; and c) installing a frame and a junction box on the laminated solar cell module, to obtain a crystalline silicon solar cell module. Current injection process is performed on the crystalline silicon solar cell module in the laminating process according to the present disclosure, which improves the performance against the light-induced degradation of the crystalline silicon solar cell. Experimental results show that a light degradation ratio of a crystalline silicon solar cell module manufactured by using the method according to the present disclosure is smaller than 1.5% on average and the cell module has a good uniformity.

BRIEF DESCRIPTION OF THE DRAWINGS

FIG. 1 is a schematic diagram of a crystalline silicon solar cell module according to an embodiment of the invention.

DETAILED DESCRIPTION

Technical solutions according to embodiments of the invention are described clearly and completely hereinafter in conjunction with the drawings. Apparently, the described embodiments are only a part rather than all of the embodiments of the invention. Any other embodiments obtained by those skilled in the art based on the embodiments in the present disclosure without any creative work fall in the scope of the invention.

In the present disclosure, the term "cell efficiency" means photoelectric conversion efficiency of a crystalline silicon solar cell.

A method for manufacturing a crystalline silicon solar cell module is provided according to the present disclosure. With reference to FIG. 1, the method includes the following steps:

a) providing a solar cell module 109 to be laminated, where the solar cell module 109 to be laminated includes a back plate 101, a first bonding layer 102, a crystalline silicon solar cell component 103, a second bonding layer 104 and a top plate 105 which are in contact in sequence, where the crystalline silicon solar cell component 103 is a crystalline silicon solar cell or a cell string formed by connecting multiple crystalline silicon solar cells 103-1, 103-2, 103-3 . . . 103 . . . n;

b) laminating the solar cell module to be laminated under a condition of current injection, to obtain a laminated solar cell module; and c) installing a frame 106 and a junction box 107 on the laminated solar cell module, to obtain a crystalline silicon solar cell module 100.

In the present disclosure, a solar cell module to be laminated is provided first, which includes a back plate, a first bonding layer, a crystalline silicon solar cell component, a second bonding layer and a top plate which are in contact in sequence. In the present disclosure, the solar cell module to be laminated may be obtained through the following: laying the second bonding layer, the crystalline silicon solar cell component, the first bonding layer and the back plate on the top plate in sequence, to obtain the solar cell module to be laminated. The back plate is used to protect the solar cell module. On one hand, it can protect the solar cell module from the environment, such as, the fluctuation of temperature and humidity, chemical substance, mechanical effect and so on. On the other hand, it can protect the environment from the solar cell module. In the present disclosure, the back plate is a back plate in accordance with Chinese nation standard "Insulating back sheet for crystalline silicon terrestrial photovoltaic (PV) modules" (GB/T 31034-2014), which is a polyester multilayer film preferably, and a thickness of the back plate is 0.3~0.7 mm preferably.

In the present disclosure, the first bonding layer is used to bond the crystalline silicon solar cell component and the back plate and improve durability and optical properties of the module. The first bonding layer is made of ethylene-vinyl acetate copolymer (EVA) preferably, and a thickness of the first bonding layer is 0.2~0.6 mm preferably.

In the present disclosure, the crystalline silicon solar cell component is a crystalline silicon solar cell or a cell string formed by connecting multiple crystalline silicon solar cells. A source of the crystalline silicon solar cell is not specifically limited in the present disclosure, and a commercial product can be used. In an embodiment according to the present disclosure, the crystalline silicon solar cell may be a p-type PERC monocrystalline silicon cell or a p-type conventional monocrystalline silicon cell. In the present disclosure, the cell string may be formed by connecting multiple crystalline silicon solar cells in series, connecting multiple crystalline silicon solar cells in parallel, or connecting multiple crystalline silicon solar cells in parallel after connecting multiple crystalline silicon solar cells in series. A method for manufacturing the cell string is not specifically limited, and the cell string may be manufactured by the following:

detecting cell efficiencies of a plurality of crystalline silicon solar cells; and soldering crystalline silicon solar cells having cell efficiencies within a predetermined range, to obtain the cell string.

In the method for manufacturing the cell string according to the present disclosure above, cell efficiencies of a plurality of crystalline silicon solar cells are detected first, to obtain a cell efficiency of each of the plurality of crystalline silicon solar cells. A method for detecting the cell efficiencies is not specifically limited in the present disclosure, and those in the art may perform the detecting by using a method familiar to those in the art. After the cell efficiency of each of the plurality of crystalline silicon solar cells is obtained, multiple crystalline silicon solar cells having cell efficiencies within a predetermined range are selected. An interval difference of the predetermined range is 0.01~0.2% preferably, and is 0.05~0.1% more preferably. For example, the predetermined range is 19.6%±0.05%, 20.2%±0.05% or 20.1%±0.05%. Finally, the selected multiple crystalline silicon solar cells are soldered, to obtain the cell string. In the present disclosure, the objective of manufacturing the cell string by using the method is to reduce differences between cell efficiencies of the multiple crystalline silicon solar cells in the cell string, to improve uniformity of the crystalline silicon solar cell module obtained in the end. In the present disclosure, the uniformity of the crystalline silicon solar cell module is a uniformity of the cell efficiencies of the crystalline silicon solar cells in the crystalline silicon solar cell module, and the smaller the differences between the cell efficiencies of the crystalline silicon solar cells are, the higher the uniformity is.

The cell efficiencies of the crystalline silicon solar cells may change in the subsequent current injection and laminating process. Thus, in order to further improve the uniformity of the crystalline silicon solar cell module obtained in the end, in the present disclosure, before detecting cell efficiencies of crystalline silicon solar cells, the method preferably includes: performing annealing process on the crystalline silicon solar cells. A temperature for the annealing process is 150~300 degrees Celsius preferably, and is 200~250 degrees Celsius more preferably. A duration of the annealing process is 15~40 min preferably, and is 20~30 min more preferably. In the present disclosure, the annealing process is performed on the crystalline silicon solar cells, so that the cell efficiencies thereof are closer to cell efficiencies of the crystalline silicon solar cells in the crystalline silicon solar cell module obtained through the current injection and laminating, thereby minimizing the reduction of the uniformity of the crystalline silicon solar cell module caused by that the cell efficiencies of the crystalline silicon solar cells change in the current injection and laminating process.

In the present disclosure, the second bonding layer is used to bond the crystalline silicon solar cell component and the top plate and improve durability and optical properties of the module. The second bonding layer is made of ethylene-vinyl acetate copolymer (EVA) preferably, and a thickness of the second bonding layer is 0.2~0.6 mm preferably.

In the present disclosure, the top plate is used to protect the crystalline silicon solar cell module. The top plate is made of glass preferably, and is made of tempered glass more preferably, and a thickness of the top plate is 2~4 mm preferably.

After the solar cell module to be laminated is obtained, the solar cell module to be laminated is laminated under a condition of current injection. A current of the current injection is 8~20 A preferably, and is 10~15 A more preferably; a temperature for the laminating is 120~200 degrees Celsius preferably, and is 140~180 degrees Celsius more preferably; a vacuum for the laminating is smaller than or equal to $10^{-4}$ Pa preferably, and is smaller than or equal to $10^{-5}$ Pa more preferably; and a duration of the laminating is 10~30 min preferably, and is 15~20 min more preferably. In the present disclosure, particular implementations of laminating the solar cell module to be laminated in a condition of current injection are not specifically limited, and may be performed as follows: putting the solar cell module to be laminated in a laminating machine first; then connecting electrodes of the crystalline silicon solar cell component in the solar cell module to be laminated to an external current source through wires; and turning on the external current source and the laminating machine in sequence, thereby achieving laminating the solar cell module to be laminated under a condition of current injection. After the laminating under a condition of current injection is finished, a laminated solar cell module is obtained. In the present disclosure, the laminated solar cell module obtained through the laminating process keeps being under current injection until the laminated crystalline silicon solar cell module cools down to room temperature.

After the laminated solar cell module is obtained, a frame and a junction box are installed on the laminated solar cell module. The method for installing the frame is not specifically limited in the present disclosure, and the frame is made of aluminum alloy preferably. The method for using and installing the junction box are not specifically limited in the present disclosure as long as they are in accordance with related requirements in Chinese specification No. CNCA/CTS 0003-2010 titled "Technical specifications of main parts for terrestrial solar cell modules—part 1: junction box". After installing the frame and the junction box, a crystalline silicon solar cell module is obtained.

Current injection process is performed on the crystalline silicon solar cells in the laminating process according to the present disclosure, which improves the performance against light-induced degradation of the crystalline silicon solar cells. In preferred embodiments according to the present disclosure, pretreatment and sorting are performed on the crystalline silicon solar cells before laminating, so that the uniformity of the crystalline silicon solar cell module obtained in the end is improved. Experimental results show a light degradation ratio of the crystalline silicon solar cell module manufactured by using the method according to the present disclosure is smaller than 1.5% on average and the cell module has a good uniformity.

For purpose of clarity, the following embodiments are described in detail.

Embodiment 1

Manufacturing Crystalline Silicon Solar Cell Modules

1) P-type conventional monocrystalline silicon cells (produced by Zhejiang Jinko Solar Co., Ltd) with a side length of 156.5 mm are put in an annealing furnace and heated to 200 degrees Celsius for 30 minutes in nitrogen atmosphere; and cell efficiencies of the monocrystalline silicon cells after being heated are detected, to select 180 monocrystalline silicon cells with cell efficiencies within the range of 19.6±0.05%.

2) Each group (totally 3 groups) including 60 cells from the selected 180 cells is soldered in series, to obtain 3 groups of cell strings. A cell string, a tempered glass with a thickness of 3 mm, an EVA with a thickness of 0.35 mm and a back plate with a thickness of 0.65 mm are laid in the order of 'back plate/EVA layer/cell string/EVA layer/tempered glass' from top to bottom. Thus, 3 solar cell modules to be laminated are obtained.

3) The solar cell modules to be laminated are put in an inner cavity of a laminating machine with the tempered glass facing down. The electrodes of each solar cell module to be laminated are connected to an external current source through wires. The external current source is turned on and its output current is set to be 10 A. Then the laminating machine is started. The temperature in the laminating machine is set to be 190 degrees Celsius and the vacuum of the inner cavity of the laminating machine is set to be $1\times10^{-5}$ Pa. The laminating machine is shut down after the laminating machine runs for 20 min, and the external current source is shut down when the solar cell modules in the inner cavity of the laminating machine cool down to room temperature. Thus laminated solar cell modules are obtained.

4) A frame and a junction box are installed on each laminated solar cell module, to obtain a crystalline silicon solar cell module.

Embodiment 2

Manufacturing Crystalline Silicon Solar Cell Modules

1) P-type PERC monocrystalline silicon cells (produced by Zhejiang Jinko Solar Co., Ltd) with a side length of 156.5 mm are put in an annealing furnace and heated to 250 degrees Celsius for 30 minutes in nitrogen atmosphere; and cell efficiencies of the monocrystalline silicon cells after being heated are detected, to select 180 monocrystalline silicon cells with cell efficiencies within the range of 20.0±0.05%.

2) Each group (totally 3 groups) including 60 cells from the selected 180 cells is soldered in series, to obtain cell strings. A cell string, a tempered glass with a thickness of 3 mm, an EVA with a thickness of 0.35 mm and a back plate with a thickness of 0.65 mm are laid in the order of 'back plate/EVA layer/cell string/EVA layer/tempered glass' from top to bottom. Thus, 3 solar cell modules to be laminated are obtained.

3) The solar cell modules to be laminated are put in an inner cavity of a laminating machine with the tempered glass facing down. The electrodes of the cell string of each solar cell module to be laminated are connected to an external current source through wires. The external current source is turned on and its output current is set to be 10 A. Then the laminating machine is started. The temperature in the laminating machine is set to be 190 degrees Celsius and the vacuum of the inner cavity of the laminating machine is set to be $1\times10^{-5}$ Pa. The laminating machine is shut down after the laminating machine runs for 20 min, and the external current source is shut down when the solar cell in the inner cavity of the laminating machine cools down to room temperature. Thus laminated solar cell modules are obtained.

4) A frame and a junction box are installed on each laminated solar cell module, to obtain a crystalline silicon solar cell module.

Embodiment 3

Manufacturing Crystalline Silicon Solar Cell Modules

1) P-type PERC monocrystalline silicon cells (produced by Zhejiang Jinko Solar Co., Ltd) with a side length of 156.5 mm are put in an annealing furnace and heated to 250 degrees Celsius for 30 minutes in nitrogen atmosphere; cell efficiencies of the monocrystalline silicon cells after being heated are detected, to select 180 monocrystalline silicon cells with cell efficiencies within the range of 20.1±0.05%.

2) Each group (totally 3 groups) including 60 cells from the selected 180 cells is soldered in series, to obtain cell strings. A cell string, a tempered glass with a thickness of 3 mm, an EVA with a thickness of 0.35 mm and a back plate with a thickness of 0.65 mm are laid in the order of 'back plate/EVA layer/cell string/EVA layer/tempered glass' from top to bottom. Thus 3 solar cell modules to be laminated are obtained.

3) The solar cell modules to be laminated are put in an inner cavity of a laminating machine with the tempered glass facing down. The electrodes of the cell string of each solar cell module to be laminated are connected to an external current source through wires. The external current source is turned on and its output current is set to be 10 A. Then the laminating machine is started. The temperature in the laminating machine is set to be 150 degrees Celsius and the vacuum of the inner cavity of the laminating machine is set to be $1\times10^{-5}$ Pa. The laminating machine is shut down after the laminating machine runs for 20 min, and the external current source is shut down when the solar cell in the inner cavity of the laminating machine cools down to room temperature. Thus laminated solar cell modules are obtained.

4) A frame and a junction box are installed on each laminated solar cell module, to obtain a crystalline silicon solar cell module.

Contrast Example 1

Manufacturing Crystalline Silicon Solar Cell Modules

1) Each group (totally 3 groups) including 60 cells from 180 p-type conventional monocrystalline silicon cells (produced by Zhejiang Jinko Solar Co., Ltd) with a side length of 156.5 mm and cell efficiencies within the range of 19.6%±0.05% are soldered in series, to obtain cell strings. A cell string, a tempered glass with a thickness of 3 mm, an EVA with a thickness of 0.35 mm and a back plate with a thickness of 0.65 mm are laid in the order of 'back plate/EVA layer/cell string/EVA layer/tempered glass' from top to bottom. Thus 3 solar cell modules to be laminated are obtained.

2) The solar cell modules to be laminated are put in an inner cavity of a laminating machine with the tempered glass facing down. And the laminating machine is started. The temperature in the laminating machine is set to be 190 degrees Celsius and the vacuum of the inner cavity of the laminating machine is set to be $1\times10^{-5}$ Pa. The laminating machine is shut down after the laminating machine runs for 20 min. Laminated solar cell modules are obtained when the solar cell modules in the inner cavity of the laminating machine cool down to room temperature.

3) A frame and a junction box are installed on each laminated solar cell module, to obtain a crystalline silicon solar cell module.

Contrast Example 2

Manufacturing Crystalline Silicon Solar Cell Modules

1) P-type PERC monocrystalline silicon cells (produced by Zhejiang Jinko Solar Co., Ltd) with a side length of 156.5 mm are put in an annealing furnace and heated to 250 degrees Celsius for 30 minutes in nitrogen atmosphere; and cell efficiencies of the monocrystalline silicon cells after being heated are detected, to select 180 monocrystalline silicon cells with cell efficiencies within the range of 20.0±0.05%.

2) Each group (totally 3 groups) including 60 cells from the selected 180 cells is soldered in series, to obtain 3 groups of cell strings. A cell string, a tempered glass with a thickness of 3 mm, an EVA with a thickness of 0.35 mm and a back plate with a thickness of 0.65 mm are laid in the order of 'back plate/EVA layer/cell string/EVA layer/tempered glass' from top to bottom. Thus 3 solar cell modules to be laminated are obtained.

3) The solar cell modules to be laminated are put in an inner cavity of a laminating machine with the tempered glass facing down. The laminating machine is started. The temperature in the laminating machine is set to be 190 degrees Celsius and the vacuum of the inner cavity of the laminating machine is set to be $1\times10^{-5}$ Pa. The laminating machine is shut down after the laminating machine runs for 20 min. Laminated solar cell modules are obtained when the solar cell modules in the inner cavity of the laminating machine cool down to room temperature.

4) A frame and a junction box are installed on each laminated solar cell module, to obtain a crystalline silicon solar cell module.

Contrast Example 3

Manufacturing Crystalline Silicon Solar Cell Modules

1) Each group (totally 3 groups) including 60 cells from 180 P-type PERC monocrystalline silicon cells (produced by Zhejiang Jinko Solar Co., Ltd) with a side length of 156.5 mm and cell efficiencies within the range of 20.1%±0.05% are soldered in series, to obtain cell strings. A cell string, a tempered glass (3 mm), an EVA (0.35 mm) and a back plate (0.65 mm) are laid in the order of 'back plate/EVA layer/cell string/EVA layer/tempered glass' from top to bottom. Thus 3 solar cell modules to be laminated are obtained.

2) The solar cell modules to be laminated are put in an inner cavity of a laminating machine with the tempered glass facing down. The electrodes of the cell string of each solar cell module to be laminated are connected to an external current source through wires. The external current source is turned on and its output current is set to be 10 A. Then the laminating machine is started. The temperature in the laminating machine is set to be 150 degrees Celsius and the vacuum of the inner cavity of the laminating machine is set to be $1\times10^{-5}$ Pa. The laminating machine is shut down after the laminating machine runs for 20 min, and the external current source is shut down when the solar cell in the inner cavity of the laminating machine cools down to room temperature. Thus laminated crystalline silicon solar cell modules are obtained.

3) A frame and a junction box are installed on each laminated crystalline silicon solar cell module, to obtain a crystalline silicon solar cell module.

Embodiment 4

Testing Performance Against Light-Induced Degradation and Uniformity of Crystalline Silicon Solar Cell Modules In the embodiment, testing the performance against light-induced degradation of an module is performed by using a conventional method, i.e., arranging the module outdoors, terminating the light-induced degradation process when the total illumination energy reaches 60 kWh, measuring the power of the module and then comparing the powers of the module before and after light-induced degradation test to obtain a light degradation ratio of the module. The smaller the light degradation ratio is, the better the performance against light-induced degradation of the module is.

The specific calculation formula is as follows: light degradation ratio=(power before light-induced degradation— power after light-induced degradation)/power before light-induced degradation.

The uniformity of the module can be tested by using electroluminescence imaging (EL imaging) technology. The uniformity of the module can be examined by observing the brightness of cells of the module in an image captured by electroluminescence imaging technology. It may be determined that the uniformity is poor in a case a difference between the brightness of the cells is larger than 20% (i.e., human eyes can tell the difference between the brightness); it may be determined that the uniformity is acceptable in a case a difference between the brightness of the cells is smaller than or equal to 20% and larger than 10%; and it may be determined that the uniformity is good in a case a difference between the brightness of the cells is smaller than or equal to 10%.

The difference between brightness of cells=(brightness of cell A−brightness of cell B)/brightness of cell A, where cell A and cell B may be any two cells in the module and the brightness of cell A is larger than or equal to that of the cell B, to ensure the difference between brightness of cells is always positive.

Test results of performance against light-induced degradation and uniformities of crystalline silicon solar cell modules manufactured according to embodiments 1~3 and contrast examples 1~3 are shown in table 1.

Table 1 test results of the performance against light-induced degradation and uniformities of the crystalline silicon solar cell modules

| Group | Light degradation ratio on average (%) | Uniformity |
|---|---|---|
| Embodiment 1 | 1 | good |
| Contrast example 1 | 2.4 | good |
| Embodiment 2 | 1.1 | good |
| Contrast example 2 | 5.2 | good |
| Embodiment 3 | 1.2 | good |
| Contrast example 3 | 1.5 | acceptable |

As can be seen from Table 1, by applying current injection to the crystalline silicon solar cells in the laminating process according to the present disclosure, the performance against light-induced degradation of the crystalline silicon solar cells is improved; and by performing pretreatment and sorting on the crystalline silicon solar cells before laminating, the uniformity of the crystalline silicon solar cell module obtained in the end is improved.

The embodiments above are only some preferred embodiments of the invention. It should be noted that those in the art may made numerous improvements and modifications without deviating from the principle of the invention, and those improvements and modifications shall fall within the scope of the invention.

What is claimed is:

1. A method for manufacturing a crystalline silicon solar cell module, comprising:
    performing an annealing process on crystalline silicon solar cells;
    connecting the annealed crystalline silicon solar cells to obtain a cell string;
    forming a solar cell module to be laminated, wherein the solar cell module to be laminated comprises a back plate, a first bonding layer, a crystalline silicon solar cell component, a second bonding layer and a top plate which are in contact in sequence, wherein the crystalline silicon solar cell component comprises the cell string;
    injecting electric current into the solar cell module to be laminated;
    laminating the solar cell module to be laminated, to which the electric current is injected, to obtain a laminated solar cell module; and
    installing a frame and a junction box on the laminated solar cell module, to obtain a crystalline silicon solar cell module.

2. The method according to claim 1, wherein the electric current is 8~20 A.

3. The method according to claim 1, wherein a temperature for the laminating is 120~200 degrees Celsius.

4. The method according to claim 1, wherein a vacuum for the laminating is smaller than or equal to $10^{-4}$ Pa.

5. The method according to claim 1, wherein a duration of the laminating is 10~30 min.

6. The method according to claim 1, further comprising:
    detecting cell efficiencies of the annealed crystalline silicon solar cells; and
    wherein connecting the annealed crystalline silicon solar cells to obtain the cell string comprises:
    soldering ones of the annealed crystalline silicon solar cells with cell efficiencies within a predetermined range, to obtain the cell string.

7. The method according to claim 1, wherein a temperature for the annealing process is 150~300 degrees Celsius.

8. The method according to claim 1, wherein a duration of the annealing process is 15~40 min.

9. The method according to claim 1, wherein connecting the annealed crystalline silicon solar cells to obtain the cell string comprises:
    connecting the annealed crystalline silicon solar cells in series.

* * * * *